United States Patent [19]
Suh

[11] Patent Number: 6,160,754
[45] Date of Patent: Dec. 12, 2000

[54] SYNCHRONOUS MEMORY DEVICE OF A WAVE PIPELINE STRUCTURE

[75] Inventor: Jung Won Suh, Kyoungki-do, Rep. of Korea

[73] Assignee: Hyundai Electronics Industries Co., Ltd., Ichon-shi, Rep. of Korea

[21] Appl. No.: 09/320,216

[22] Filed: May 26, 1999

[30] Foreign Application Priority Data

May 27, 1998 [KR] Rep. of Korea .................. 98-19341

[51] Int. Cl.⁷ ............................................. G11C 8/00
[52] U.S. Cl. .................................. 365/233; 365/194
[58] Field of Search ................................. 365/233, 194

[56] References Cited

U.S. PATENT DOCUMENTS

| | | | |
|---|---|---|---|
| 4,931,993 | 6/1990 | Urushima | 365/189.01 |
| 5,369,618 | 11/1994 | Takasugi | 365/230.01 |
| 5,568,427 | 10/1996 | Takemae | 365/189.02 |
| 5,838,631 | 11/1998 | Mick | 365/233 |

*Primary Examiner*—David Nelms
*Assistant Examiner*—M. Tran
*Attorney, Agent, or Firm*—Jacobson, Price, Holman & Stern, PLLC

[57] ABSTRACT

A synchronous memory device of a wave pipeline structure includes: an internal clock signal generation means which generates an internal clock signal being a standard of an output data only during a period in which an output enable signal is activated; and a data transmission means which is connected between an output terminal of a plurality of registers and an output driver, is switched by a control of the internal clock signal, receives data stored in an activated register as input, and transmits the data to the output driver. As a result, the synchronous memory device greatly improves the data access path and the data output hold time, enhances the stability and performance of a memory operation, and achieves a high-speed operation.

8 Claims, 7 Drawing Sheets

SYNCHRONOUS MEMORY DEVICE OF A WAVE PIPELINE STRUCTURE

BACKGROUND OF THE INVENTION

1. Field of the Invention

The present invention relates to a synchronous memory device of a wave pipeline structure. More particularly, it relates to a synchronous memory device of a wave pipeline structure which improves data access time by reducing the data access path, thus enhances the stability and performance of a memory operation and achieves a high-speed operation.

2. Description of the Prior Art

Conventionally, various kinds of pipeline structures have been applied to a synchronous memory device in order to achieve a high-speed column path. A wave pipeline structure which is one of the pipeline structures and uses a plurality of registers at its output terminal, has a relatively simple circuit embodied on a small area and also has advantage to a high-speed operation.

FIG. 1A is a block diagram of a conventional synchronous memory device of a wave pipeline structure, and it schematically shows a column path during a read operation.

Referring to FIG. 1A, if a read command is input, a column address signal passing through a column address buffer 1 is synchronized by an internal clock signal ICLK, is set to a burst column address counter 3, passes through a column address decoder 5, and thus accesses a bit line sense-amp inside of a bank 7 corresponding to a column address.

At this time, a column selection signal Yi generated from the column address decoder 5 transmits the data being sensed and amplified by the bit line sense-amp to local input/output lines L_IO and /L_IO. The transmitted data is amplified by an input/output sense-amp (IO S/A) 9, passes through a global input/output line G_IO, and is stored in one register among N registers 11-1n (register0 registerN-1).

In addition, there is a read data controller 20 in an output terminal, the read data controller 20 generates an output enable signal OE for controlling an output driver 30, an input control signal PI<0:N-1> of the N registers 11-1n, and an output control signal PO<0:N-1> of the N registers 11-1n, thereby controlling output data.

Thereafter, whenever data is transmitted after passing through global input/output line G_IO by a burst read operation, the input control signals PI<0:N-1> of the registers are sequentially activated, the inputs of the registers are sequentially controlled, and thus the data are sequentially stored in the registers 11-1n. Since the register output control signals PO<0:N-1> are sequentially activated from 'CL-1'-th clock after a read command, the data stored in the registers 11-1n are sequentially outputted to a data output pin DQ-pin via the output driver 300.

Generally, a burst length BL is greater than the number N of registers in a burst read operation. But, there is no problem in a data output operation even if the data is input again to a register having stored data, because the stored data is already outputted.

FIG. 1B is an operation timing diagram of the synchronous memory device shown in FIG. 1A. FIG. 1B illustrates a relation among an internal clock signal ICLK, the register data output control signals PO<0:N-1> and a data output DQ, in case that a CAS (column address strobe) latency CL is set to 3 and a burst length BL is set to 4.

As shown in FIG. 1B, a data output control signal PO<0> of a first register (register0) is activated by 'CL-1'-th clock from a read command input clock, and then the data stored in the register (registers) is outputted to the data output pin DQ-pin via the output driver 30. According to this method, the output control signals PO<1>, PO<2> and PO<0> are sequentially activated by the next clock signal, so that the data stored into a plurality of registers (register1, register2 and register0) are sequentially outputted to the data output pin DQ-pin.

Although register input control signal PI<0:2> is not shown in FIG. 1B, the input control signals PI<O>, PI<1>, and PI<2> are activated whenever the data is transmitted to the output terminal via the global input/output line, so that a plurality of transmission gates MTI_0, MTI_1 and MTI_2 connected to the input terminals of the registers are turned on. Therefore, the data are sequentially stored into the registers.

By this operation method, a data access time tAC in the conventional synchronous memory device is determined by the sum of a skew from an external clock to an internal clock, a delay from the internal clock to a register output control signal PO, and a delay from a register controlled by the register output control signal PO to a data output pin.

Also, the conventional synchronous memory device having a wave pipeline structure controls output data by sequentially controlling an input/output operation of N registers positioned at each output terminal. At this time, the register output control signals PO<0:N-1> are generated by using a rising edge of the clock as a standard, and they control each output of the registers.

However, in this case, since several logic gates are needed between the external input clock CLK and the register output control signals, a high-speed operation of the data is limited, and a clock skew between the external clock signal CLK and the internal clock signal ICLK occurs. As a result, if a large-sized chip is used, the high-speed operation becomes more difficult.

SUMMARY OF THE INVENTION

Accordingly, the present invention is directed to a synchronous memory device of a wave pipeline structure that substantially obviates one or more of the problems due to limitations and disadvantages of the related art.

It is an object of the present invention to provide a synchronous memory device of a wave pipeline structure which improves data access time by reducing the data access path, thus enhances the stability and performance of a memory operation and achieves a high-speed operation.

To achieve the above object, in a synchronous memory device of a wave pipeline structure having a plurality of registers connected in parallel between a global input/output line and an output driver, a synchronous memory device of a wave pipeline structure includes: an internal clock signal generation means which generates an internal clock signal being used as a standard of output data only during a period in which an output enable signal is activated; and data transmission means which is connected between an output terminal of the plurality of registers and the output driver, is switched by a control of the internal clock signal, receives data stored in an activated register as an input, and transmits the data to the output driver.

Additional features and advantages of the invention will be set forth in the description which follows, and in part, will be apparent from the description, or may be learned by practice of the invention. The objective and other advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

Further objects and other advantages of the present invention will become apparent from the following description in conjunction with the attached drawings, in which.

DETAILED DESCRIPTION OF THE PREFERRED EMBODIMENT

A preferred embodiment of the present invention will now be described in detail with reference to the accompanying drawings.

Figure 1A:
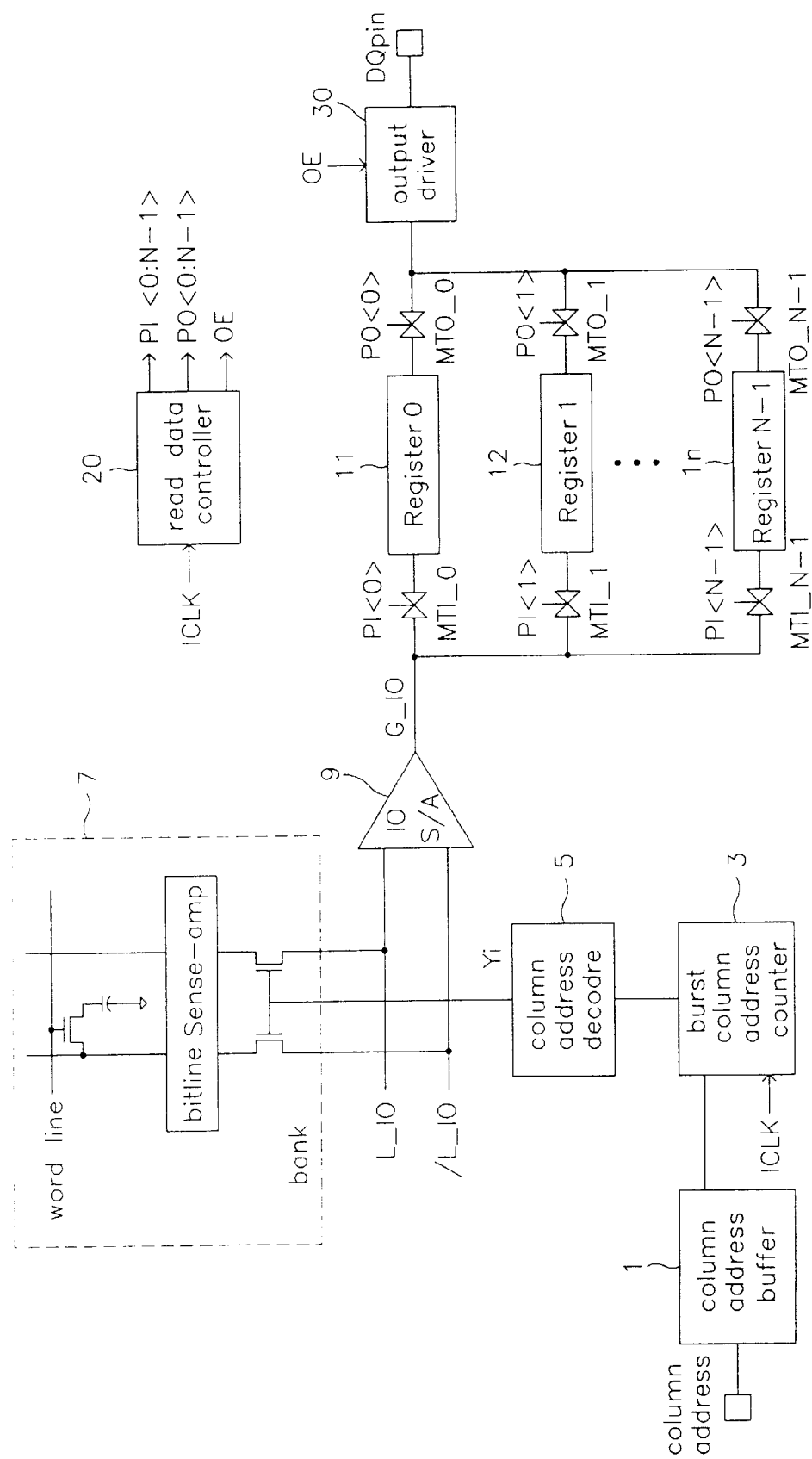
FIG. 1A is a block diagram of a conventional synchronous memory device of a wave pipeline structure.
Figure 1B:
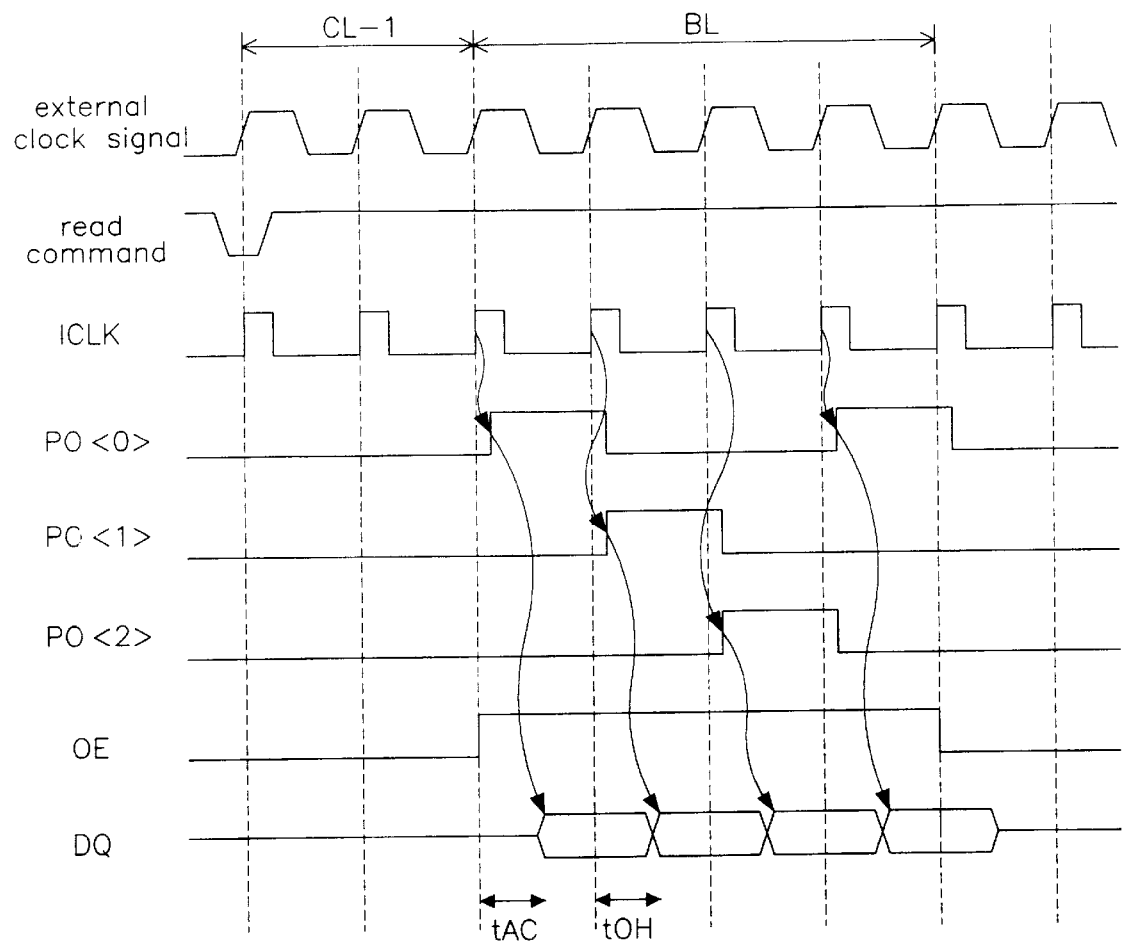
FIG. 1B is an operation timing diagram of the synchronous memory device shown in FIG. 1A.
Figure 2A:
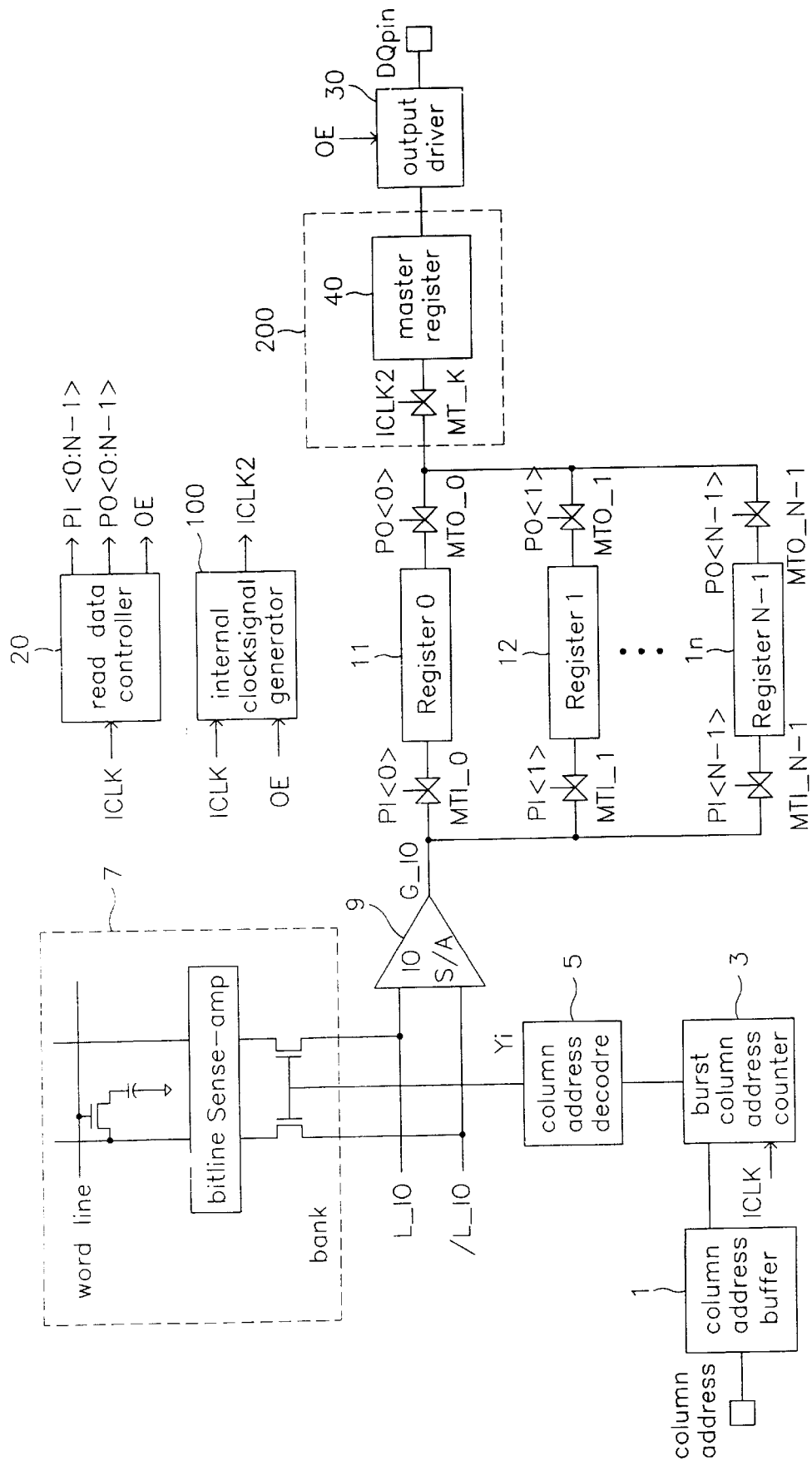
FIG. 2A is a block diagram of a synchronous memory device of a wave pipeline structure according to the present invention.

FIG. 2A is a block diagram of a synchronous memory device of a wave pipeline structure according to the present invention. In addition to the conventional synchronous memory device of FIG. 2A, the synchronous memory device of FIG. 2A further includes: an internal clock signal generator 100 which generates a second internal clock signal ICLK2 being a standard of the output data only during a period in which an output enable signal OE is activated; and a data transmission means 200, which is connected between an output terminal of the plurality of registers 11-1n and the output driver 30, is switched by a control of the second internal clock signal ICLK2, receives data stored in an activated register as an input, and transmits the data to the output driver 30.

The data transmission means 200 includes: a transmission gate MT_K which is a switching element selectively turned on by the second internal clock signal ICLK2; and a master register 40 which is connected in series to the transmission gate MT_K.

By such construction, the output data is not generated by using an external clock signal CLK as a standard, and is outputted by using the second internal clock signal ICLK2 as a standard, the second internal clock signal ICLK2 being activated only when effective data is outputted. Accordingly, the data access path becomes simplified, and a high speed data access time is ensured.

The internal clock signal generator 100 receives the external clock signal CLK and an output enable signal OE, generates a short pulse signal during a period from a CAS latency(CL)-1st clock to a burst length BL by using a read command input clock as a standard, and thus controls an input of the master register 40.

In this case, to achieve a constant data output hold time, a delay part (shown in FIG. 3A as the reference numeral 50) for inducing a constant delay between the external clock signal CLK and the second internal clock signal ICLK2 is included in the internal clock signal generator 100. Therefore, the internal clock signal generator 100 controls the input of the master register 40 not to be influenced by a clock skew between two clock signals CLK and ICLK2.

Figure 2B:
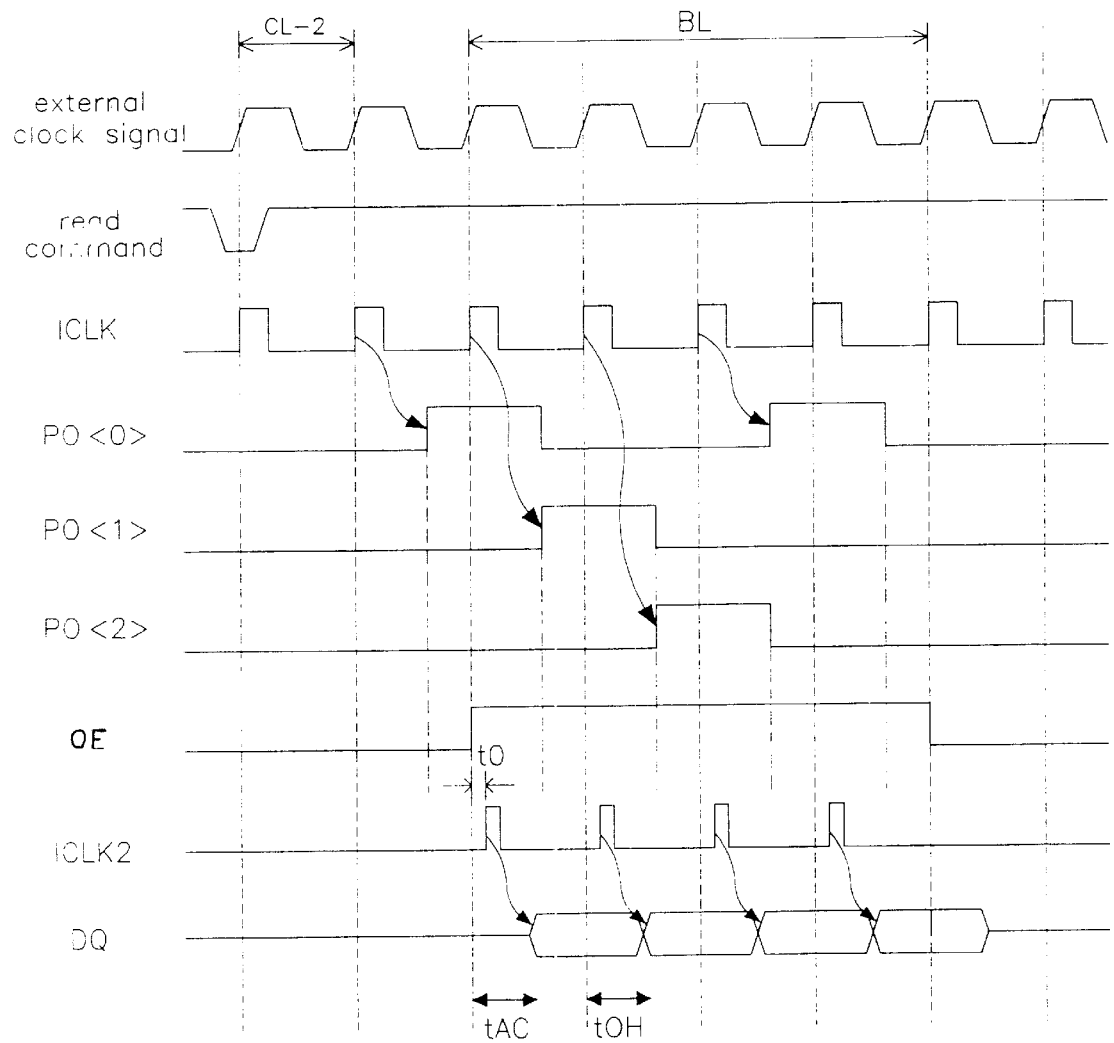
FIG. 2B is an operation timing diagram of the synchronous memory device shown in FIG. 2A.

FIG. 2B is an operation timing diagram of the synchronous memory device shown in FIG. 2A, and illustrates a case where a CAS latency CL is set to 3 and a burst length BL is set to 4.

As shown in FIG. 2B, register output control signals PO<0:2> are sequentially activated from a CAS latency (CL)-2nd clock. An output data passes through the master register 40 and the output driver 30 by using the second internal clock signal ICLK2 as a standard, and is then outputted to a data output pin DQ-pin.

The output control signals PO<0>, PO<1> and PO<2> of the registers are continuously maintained during a pulse of the second internal clock signal ICLK2, and thus the data stored in the registers are transmitted to the master register 40. At this time, the second internal clock signal ICLK2 generates a pulse only while the output enable signal OE is activated, and each pulse is delayed from the external clock signal CLK by a delay time t0. The delay time t0 becomes a delay for ensuring the data output hold time tOH.

The reason why the delay time to is needed is as follows. As previously stated in FIG. 2A, data stored in the register is transmitted to the master register 40 by the second internal clock signal ICLK2 and is then transmitted to a data output pin DQ-pin via the output driver 30, previous data is maintained during the delay time t0. Accordingly, since the data output hold time tOH is constantly maintained, the data is not influenced by a clock skew between two clock signals CLK and ICLK2.

Therefore, a data access path becomes more simplified as compared with the prior art, that is, the data access path is the second internal clock signal ICLK2→the master register 40→the output driver 30→the data output pin DQ-pin.

Figure 3A:
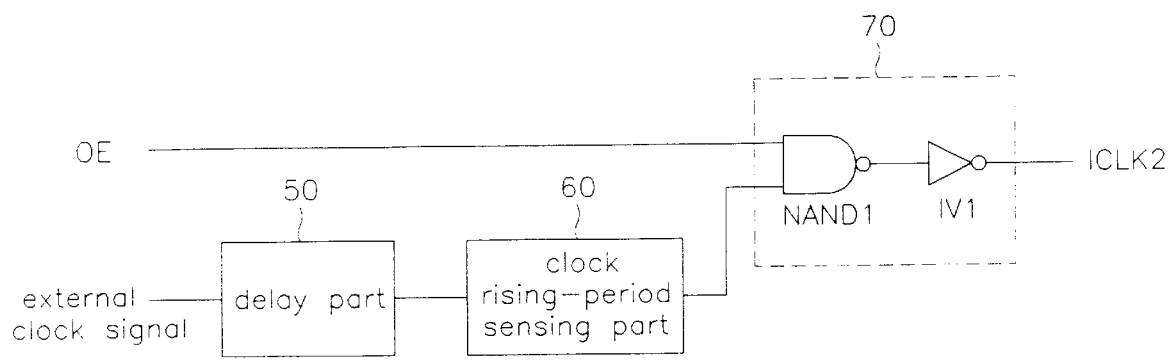
FIG. 3A, is a block diagram of an internal clock signal generator shown in FIG. 2A.

FIG. 3A is a block diagram of the internal clock signal generator 100 shown in FIG. 2A. As shown in FIG. 3A, the internal clock signal generator 100 includes: a delay part 50 which delays an external clock signal CLK by a delay time to ensuring the data output hold time tOH; a clock rising-period sensing part 60 which is connected to an output terminal of the delay part 50, and senses a rising period of the external clock signal CLK; and a logic operation part 70 which receives an output enable signal OE and an output signal of the clock rising-period sensing part 60, performs a logic operation about the output enable signal OE and the 60's output signal, and generates an internal clock signal ICLK2 having a constant pulse width at the rising period of the external clock signal CLK.

The logic operation part 70 includes a NAND gate NAND1 and an inverter IV1, and functions as an AND logic element. By the output enable signal OE, a pulse is generated only in a clock used as a standard of the output data, thereby preventing an unnecessary operation of the output terminal.

Figure 3B:
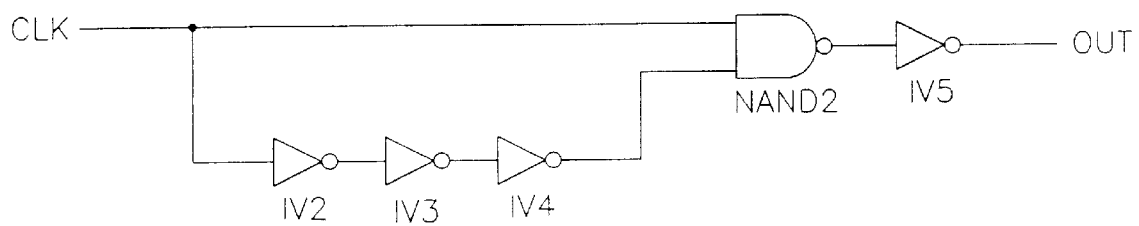
FIG. 3B is a circuit diagram illustrating a first embodiment of a clock rising-period sensing part shown in FIG. 3A.

FIG. 3B is a circuit diagram illustrating a first embodiment of a clock rising-period sensing part 60 shown in FIG. 3A. As shown in FIG. 3B, the clock rising-period sensing part 60 includes: a plurality of inverting delay elements IV2–IV4 which invert the external input clock signal CLK, and delay the external input clock signal CLK by a constant time; and logic gates NAND2 and IV5 which function as AND logic element, and receive the external input clock signal CLK and an output signal of the inverting delay elements IV2–IV4.

By such construction, the clock rising-period sensing part 60 generates a short pulse having a pulse width by a delay time t1 achieved by the inverting delay elements IV2–IV4, at every rising-period of the external clock signal CLK.

Figure 3C:
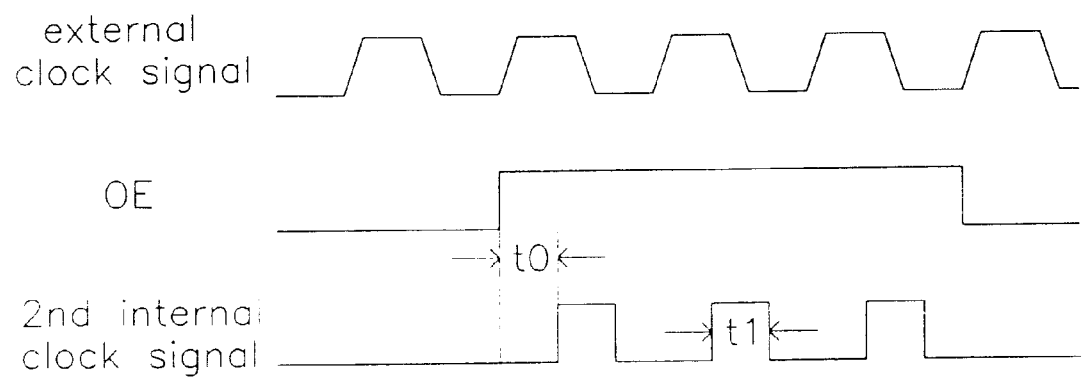
FIG. 3C is an operation timing diagram of an internal clock signal generator shown in FIG. 2A.

FIG. 3C is an operation timing diagram of the internal clock signal generator 100 shown in FIG. 2A. As shown in FIG. 3C, a pulse of the second internal clock signal ICLK2 is generated only while the output enable signal OE is activated, each pulse is delayed by the delay time t0 from the external clock signal CLK, and the pulse width becomes the delay time t1.

As stated above, the synchronous memory device according to the present invention generates the second internal clock signal ICLK2 only when the internal clock signal generator 100 outputs effective data, and uses the second internal clock signal ICLK2 for a data output operation. Accordingly, the data access path is simplified, that is, the data access path is the second internal clock signal ICLK2→a transmission gate MT_K→the master register 40→the output driver 30→the data output pin DQ-pin.

As described above, a synchronous memory device of a wave pipeline structure according to the present invention simplifies the data access path, greatly improves the data access path and the data output path, and achieves a high-speed operation. In addition, since an additional circuit for reducing a clock skew is not required, ensuring a high-speed access time is better facilitated.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of a novelty that reside in the present invention, including all features that would be treated as equivalents thereof by those skilled in the art to which this invention pertains.

What is claimed is:

1. In a synchronous memory device of a wave pipeline structure having a plurality of registers connected in parallel between a global input/output line and an output driver, a synchronous memory device of a wave pipeline structure comprising:

an internal clock signal generation means which generates an internal clock signal being a standard of an output data only during a period in which an output enable signal is activated, said internal clock signal generation means including,
 a delay part which delays an external clock signal by a predetermined time;
 a clock rising-period sensing part which is connected to an output terminal of the delay part, and senses a rising-period of the external clock signal; and
 a logic operation part which receives the output enable signal and an output signal of the clock rising-period sensing part, performs a logic operation about them, and generates an internal clock signal having a constant pulse width in the rising period of the external clock signal; and a data transmission means which is connected between an output terminal of the plurality of registers and the output driver, is switched by a control of the internal clock signal, receives data stored in an activated register as an input, and transmits the data to the output driver.

2. The synchronous memory device of a wave pipeline structure as set forth in claim 1, wherein the clock rising-period sensing part comprises:

a plurality of inverting delay elements which invert the external input clock signal, and delay the external input clock signal by a predetermined time; and
an AND combinational logic element which receives the external clock signal and the output signal of the inverting delay elements.

3. The synchronous memory device of a wave pipeline structure as set forth in claim 1, wherein the logic operation part is comprised of an AND combinational logic element.

4. A synchronous memory device of a wave pipeline structure as set forth in claim 1, wherein the data transmission means comprises:

a switching element which is switched by the internal clock signal; and
a master register which is connected in series to the switching element.

5. The synchronous memory device of a wave pipeline structure as set forth in claim 4, wherein the switching element is comprised of a transmission gate.

6. In a synchronous memory device of a wave pipeline structure having a plurality of registers connected in parallel between a global input/output line and an output driver, a synchronous memory device of a wave pipeline structure comprising:

an internal clock signal generation means which generates an internal clock signal being used as a standard of an output data only during a period in which an output enable signal is activated; and
a data transmission means which is connected between an output terminal of the plurality of registers and the output driver, is switched by a control of the internal clock signal, receives data stored in an activated register as an input, and transmits the data to the output driver, said data transmission means including,
 a switching element which is switched by the internal clock signal; and
 a master register which is connected in series to the switching element.

7. The synchronous memory device of a wave pipeline structure as set forth in claim 6, wherein the switching element is comprised of a transmission gate.

8. The synchronous memory device of a wave pipeline structure as set forth in claim 6, wherein said internal clock signal generation means includes:

a clock rising-period sensing part which senses a rising-period of the external clock signal; and
a logic operation part which receives an output signal from said clock rising-period sensing part and generates an internal clock signal having a constant pulse width in the rising period of the external clock signal.

* * * * *